United States Patent
Jost et al.

(10) Patent No.: US 6,620,734 B1
(45) Date of Patent: Sep. 16, 2003

(54) METHODS OF FORMING PROTECTIVE SEGMENTS OF MATERIAL, AND ETCH STOPS

(75) Inventors: Mark E. Jost, Boise, ID (US); Keith Cook, Boise, ID (US); Erik Byers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/283,774

(22) Filed: Oct. 29, 2002

Related U.S. Application Data

(62) Division of application No. 10/098,680, filed on Mar. 12, 2002.

(51) Int. Cl.[7] .............................................. H01L 21/311
(52) U.S. Cl. ...................................... 438/700; 438/733
(58) Field of Search ................................ 438/235, 239, 438/381, 396, 637, 639, 689, 697, 700, 706, 714, 733, 740, 743, 744, 745, 970

(56) References Cited

U.S. PATENT DOCUMENTS

| 5,275,972 A | * | 1/1994 | Ogawa et al. | 438/733 |
| 5,392,189 A | * | 2/1995 | Fazan et al. | 361/305 |
| 6,057,243 A | * | 5/2000 | Nagayama | 438/700 |

* cited by examiner

Primary Examiner—David Nhu
(74) Attorney, Agent, or Firm—Wells St. John P.S.

(57) ABSTRACT

The invention encompasses a method of forming a protective segment of material. A plurality of at least three conductive lines are provided over a semiconductor substrate. A material is formed over the conductive lines, and a patterned masking layer is formed to cover a segment of the material extending between a pair of the conductive lines while leaving another segment of the material uncovered. The uncovered segment of the material is anisotropically etched to form separated spacers from the uncovered segment. The separated spacers are along sidewalls of at least two of the conductive lines. The covered segment of the material remains after the anisotropic etching, and is a protective segment of the material over the semiconductor substrate.

26 Claims, 12 Drawing Sheets

METHODS OF FORMING PROTECTIVE SEGMENTS OF MATERIAL, AND ETCH STOPS

RELATED PATENT DATA

This patent resulted from a divisional application of U.S. patent application Ser. No. 10/098,680, which was filed on Mar. 12, 2002.

TECHNICAL FIELD

The invention pertains to methods of forming protective segments of material, and in particular applications pertains to methods of forming etch stops. The invention can also pertain to methods of forming protective segments over digit lines.

BACKGROUND OF THE INVENTION

It is frequently desired to form protective materials over circuit constructions during semiconductor device fabrication. The protective materials protect the covered circuit constructions from being exposed to conditions which could be detrimental to the circuit constructions. For instance, it can be desired to form an etch stop over a circuit construction so that subsequent etching conditions do not penetrate to the circuit construction.

A difficulty in forming protective segments over circuit constructions, occurs in trying to avoid excess processing steps. Specifically, a continuing goal in semiconductor circuit device fabrication is to reduce fabrication steps in order to increase throughput of devices through a fabrication process.

SUMMARY OF THE INVENTION

In one aspect, the invention encompasses a method of forming a protective segment of material. A plurality of at least three conductive lines are provided over a semiconductor substrate. A material is formed over the conductive lines, and a patterned masking layer is formed to cover a segment of the material extending between a pair of the conductive lines while leaving another segment of the material uncovered. The uncovered segment of the material is anisotropically etched to form separated spacers from the uncovered segment. The separated spacers are along sidewalls of at least two of the conductive lines. The covered segment of the material remains after the anisotropic etching, and is a protective segment of the material over the semiconductor substrate.

In one aspect, the invention encompasses a method of forming a patterned etch stop.

In one aspect, the invention encompasses a method of protecting a digit line contact during etching of container openings.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

In particular aspects, the invention encompasses methods in which a common material is utilized for forming both anisotropically etched sidewall spacers and a protective segment over circuit structures. An exemplary embodiment of the invention is described with reference to FIGS. 1–4.

Figure 1:
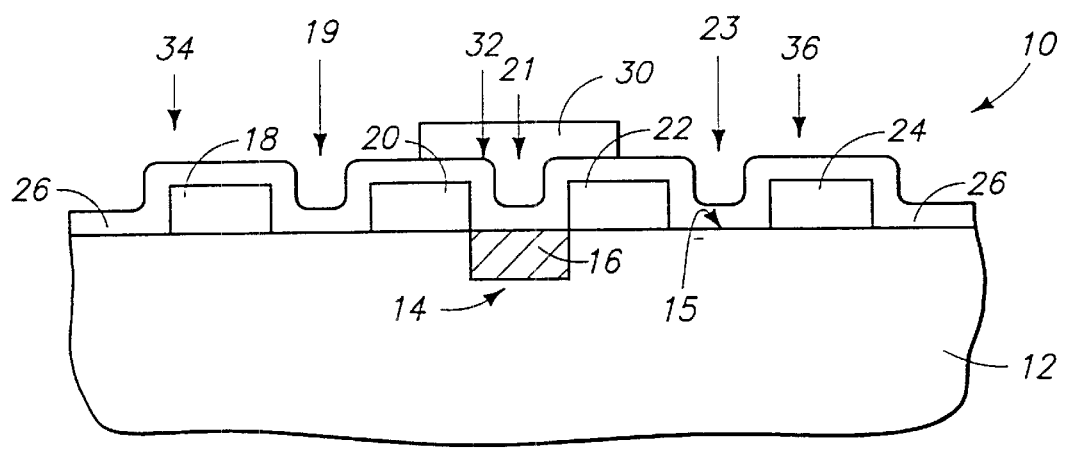
FIG. 1 is a diagrammatic, cross-sectional view of a semiconductor wafer fragment at a preliminary processing step in accordance with an exemplary embodiment of the present invention.

Referring initially to FIG. 1, a fragment 10 of a semiconductor wafer construction is illustrated. Fragment 10 comprises a substrate 12 which can include, for example, monocrystalline silicon lightly doped with a background p-dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An electrical node location 14 is supported by substrate 12, and a node 16 is illustrated within location 14. Node 16 can comprise, for example, a conductive plug, such as, for example, a plug comprising one or more of metal, metal silicide, metal nitride, or conductively-doped silicon. Alternatively, node 16 can comprise a conductively-doped diffusion region within a semiconductive material substrate 12. In particular embodiments, node 16 can comprise a simple electrical interconnect, and in other applications node 16 can comprise at least a portion of a circuit device.

Substrate 12 has an upper surface 15, and a plurality of conductive lines 18, 20, 22, and 24 are formed across such upper surface. Lines 18, 20, 22, and 24 can comprise various conductive materials, including, for example, metal, metal silicide, metal nitride, or conductively-doped silicon. In particular applications, the lines can be wordline constructions, and accordingly can comprise a stack which includes silicon dioxide, conductively-doped silicon, metal, and an insulative material cap (with such stack being known to persons of ordinary skill in the art, and not shown in the diagrammatic illustration of FIG. 1).

Although the shown construction comprises four conductive lines, it is to be understood that such is an exemplary application, and that other numbers of conductive lines can be provided over a semiconductor substrate in various aspects of the invention. For instance, at least three conductive lines can be provided over a semiconductor substrate in particular aspects of the invention, and in other particular aspects at least four conductive lines can be provided over a semiconductor substrate.

Conductive lines 18, 20, 22 and 24 are spaced from one another by gaps 19, 21 and 23. Accordingly, conductive lines 18, 20, 22 and 24 can be referred to as adjacent, spaced conductive lines.

A material 26 is formed over lines 18, 20, 22 and 24, as well as over upper surface 15 of substrate 12. Material 26 can comprise a single layer, or a stack of separate layers. Material 26 can comprise an electrically insulative material, and in particular applications comprises silicon nitride. In the illustration of FIG. 1, material 26 is illustrated as a single homogeneous material for diagrammatic purposes, but it is to be understood that the material 26 can, in particular applications, comprise a stack of different materials. In specific applications, material 26 comprises a pair of layers, with the underlying layer being silicon nitride and the uppermost layer being silicon dioxide.

A patterned masking layer 30 is formed over a segment of material 26. Masking layer 30 can comprise, for example, photoresist, and can be formed utilizing photolithographic patterning methods.

The segment of material 26 covered by material 30 is illustrated generally with a label 32, and includes an expanse of material 26 extending within gap 21 and between lines 20 and 22. The segment 32 further includes portions of material 26 that are over lines 20 and 22. Patterned masking layer 30 leaves various portions 34 and 36 of material 26 not covered, and the portions 34 and 36 can be referred to together as an uncovered segment of material 26.

Figure 2:
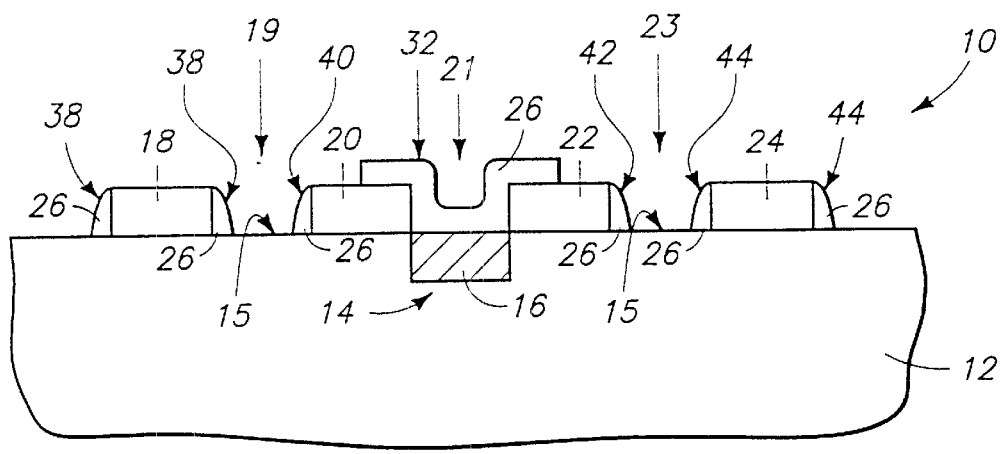
FIG. 2 is a view of the FIG. 1 fragment shown at a processing step subsequent to that of FIG. 1.

Referring to FIG. 2, the uncovered segment of material 26 (specifically the segment encompassing portions 34 and 36 of FIG. 1) is anisotropically etched, while segment 32 of material 26 is protected by masking layer 30 (FIG. 1). The anisotropic etching forms spacers 38 along sidewalls of line 18, a spacer 40 along a sidewall of line 20, a spacer 42 along a sidewall of line 22, and spacers 44 along sidewalls of line 24. The spacers are spaced from one another, and accordingly can be referred to as separated spacers.

The adjacent spacers proximate gaps 19 and 23 are spaced from one another to expose upper surface 15 of substrate 12 within the gaps 19 and 23. Specifically, spacer 38 is separated from spacer 40, to leave gap 19 extending to upper surface 15 of substrate 12; and spacer 42 is separated from spacer 44 to leave upper surface 15 of substrate 12 exposed within gap 23.

Masking layer 30 (FIG. 1 is removed) to leave segment 32 as the only protective material extending across gap 21. Segment 32 extends from over conductive line 20 to over conductive line 22, and thus extends over a section of upper surface 15 of substrate 12 within gap 21. Segment 32 covers the electrical node 16 within location 14.

Figure 3:
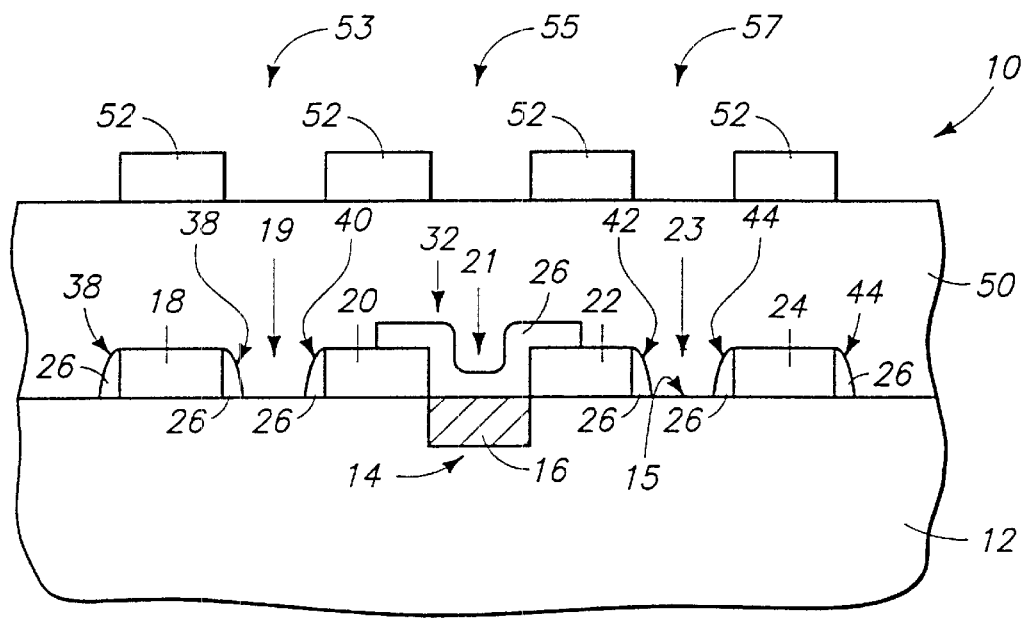
FIG. 3 is a view of the FIG. 1 fragment shown at a processing step subsequent to that of FIG. 2.

Referring to FIG. 3, a mass 50 is formed over lines 18, 20, 22 and 24, as well as over segment 32. Mass 50 can comprise, for example, an insulative material, and in particular applications can comprise borophosphosilicate glass (BPSG).

A patterned masking layer 52 is formed over mass 50. Masking layer 52 can comprise, for example, photoresist and can be patterned utilizing photolithographic processing. Layer 52 comprises a series of blocks, separated by gaps 53, 55 and 57. Each of gaps 53, 55 and 57 is approximately over the gaps 19, 21 and 23, respectively.

Figure 4:
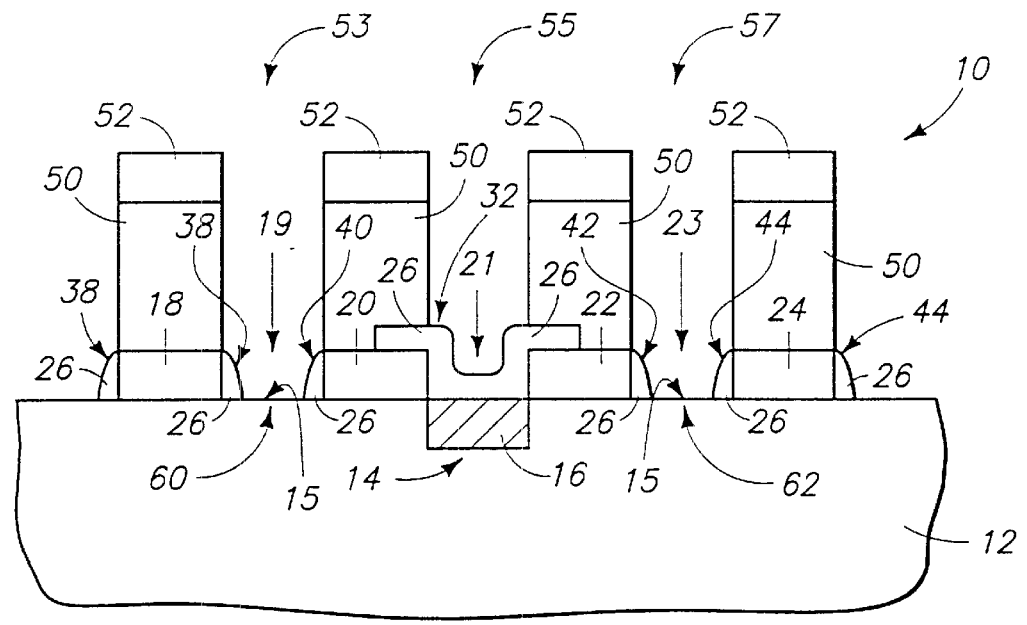
FIG. 4 is a view of the FIG. 1 fragment shown at a processing step subsequent to that of FIG. 3.

Referring to FIG. 4, gaps 53, 55 and 57 are extended downwardly through material 50 with a suitable etch. Preferably, the etch is selective for the material of mass 50 relative to the material of segment 32, and accordingly segment 32 can function as an etch stop during the removal of portions of mass 50. Accordingly, the shown opening 55 stops on segment 32, rather than extending to electrical component 16. In embodiments in which segment 26 comprises silicon nitride and mass 50 comprises BPSG, various etch chemistries can be chosen which are selective for mass 50 relative to segment 32.

Openings 53 and 57 extend to an upper surface 15 of substrate 12. In particular applications, the regions of substrate 12 beneath openings 53 and 57 can be considered as node locations 60 and 62. Conductive materials can be provided within such node locations either after formation of openings 53 and 57, or prior to formation of such openings. Capacitor constructions can then be formed within the openings and in electrical contact with conductive materials provided at node locations 60 and 62. Openings 53 and 57 can thus be considered as containers for retaining capacitor constructions.

Masking layer 52 would typically be removed prior to formation of capacitor constructions within the openings. In particular applications, electrical component 16 is a digit line connection (or contact), and a pair of capacitor constructions are formed within openings 53 and 57 to form DRAM cells comprising the capacitor constructions and digit line contact. It should be understood that in such applications the DRAM cells formed with the construction of FIG. 4 can be part of a large array, and accordingly adjacent DRAM cells can be formed at locations which are either in or out of the page relative to the shown view of fragment 10. Such adjacent DRAM cells can have capacitor containers which extend into opening 55, and accordingly capacitor structures can be formed within opening 55. Such structures can be electrically isolated from electrical component 16 by protective segment 32.

In applications in which capacitor structures are formed within openings 53, 55 and 57, it can be advantageous to have relatively deep/narrow openings. Accordingly, the openings can be at least about 2000 Angstroms deep, and from about 300 Angstroms to about 800 Angstroms in maximum width.

The embodiment of FIGS. 1–4 comprises patterning of a material (26) to simultaneously form spacers (38, 40, 42 and 44) and a protective segment (32). Such patterning occurs prior to formation of a mass (50) over the material. Another exemplary application of the invention is described with reference to FIGS. 5–11, and such application illustrates processing in which a mass is formed over a material prior to formation of spacers and a protective segment from the material. In referring to FIGS. 5–11, similar numbering will be utilized as was used above in describing FIGS. 14, where appropriate.

Figure 5:
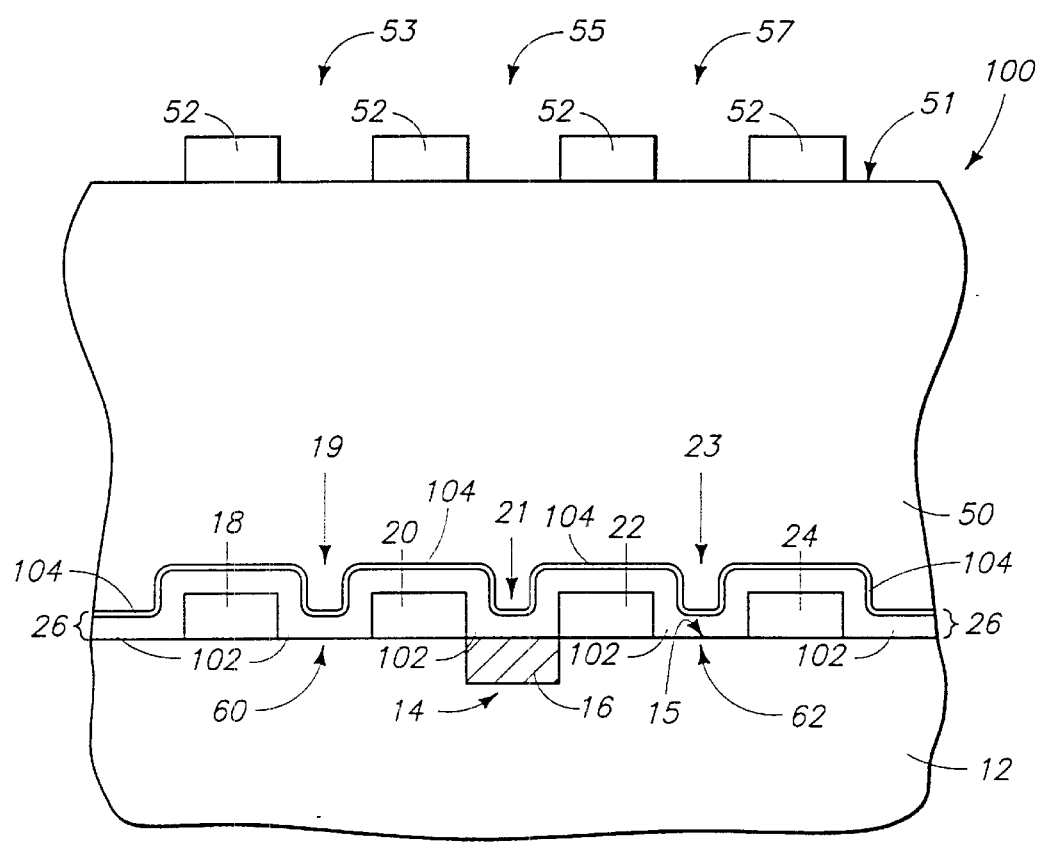
FIG. 5 is a diagrammatic, cross-sectional view of a semiconductor wafer fragment shown at a preliminary step of another exemplary embodiment of the present invention.

Referring initially to FIG. 5, a fragment 100 of a semiconductor construction is illustrated at a preliminary stage of a semiconductor device fabrication process. Fragment 100 comprises a substrate 12 having a node location 14 defined therein, and an electrical component 16 within node location 14. Substrate 12 also has electrical node locations 60 and 62 defined therein, and in the shown exemplary embodiment conductive components are not present in locations 60 and 62 at the processing step of FIG. 5. It is to be understood, however, that the invention encompasses other applications in which conductive components are present in locations 60 and 62 at the processing step of FIG. 5. Such components can comprise conductively-doped diffusion regions, or conductive plugs comprising one or more of metal, metal silicide, metal nitride, and conductively-doped silicon.

Substrate 12 has an upper surface 15, and conductive lines 18, 20, 22 and 24 are formed across such upper surface. A material 26 extends over lines 18, 20, 22 and 24, as well as over substrate 12. In the shown embodiment, material 26 comprises two distinct layers 102 and 104. Layer 102 can comprise, for example, silicon nitride or silicon oxynitride; and layer 104 can comprise, for example, silicon dioxide. In particular applications, layer 102 will consist of, or consist essentially of, silicon nitride and/or silicon oxynitride; and layer 104 will consist of, or consist essentially of silicon dioxide. Layer 102 can be formed by, for example, low pressure chemical vapor deposition of nitride, and can be formed to a thickness of about 300 Angstroms. Layer 104 can be formed by, for example, chemical vapor deposition from tetraethyl orthosilicate (TEOS), and can be formed to a thickness of about 50 Angstroms. It can be advantageous to have the shown silicon dioxide layer 104 over a nitride layer 102 in that subsequent processing can form a photoresist in contact with material 26, and the silicon dioxide layer 104 can alleviate or prevent diffusion of nitrogen from a nitrogen-comprising layer 102 into the photoresist. Diffusion of nitrogen into photoresist can be problematic, in that it can disrupt subsequent development of the photoresist.

A mass 50 is formed over material 26. Mass 50 can comprise an insulative material, such as, for example, BPSG. Mass 50 has an upper surface 51, and such upper surface can be planarized. The planarization can be accomplished by, for example, chemical-mechanical planarization. Mass 50 can comprise a thickness of at least about 2,000 Angstroms between lowermost surfaces of material 26 and planarized surface 51.

A patterned masking layer 52 is formed over surface 51 of mass 50. Masking layer 52 can comprise, for example, photoresist, and can be patterned by a photolithographic processing.

Gaps 53, 55 and 57 extend between blocks of patterned masking layer 52.

Figure 6:
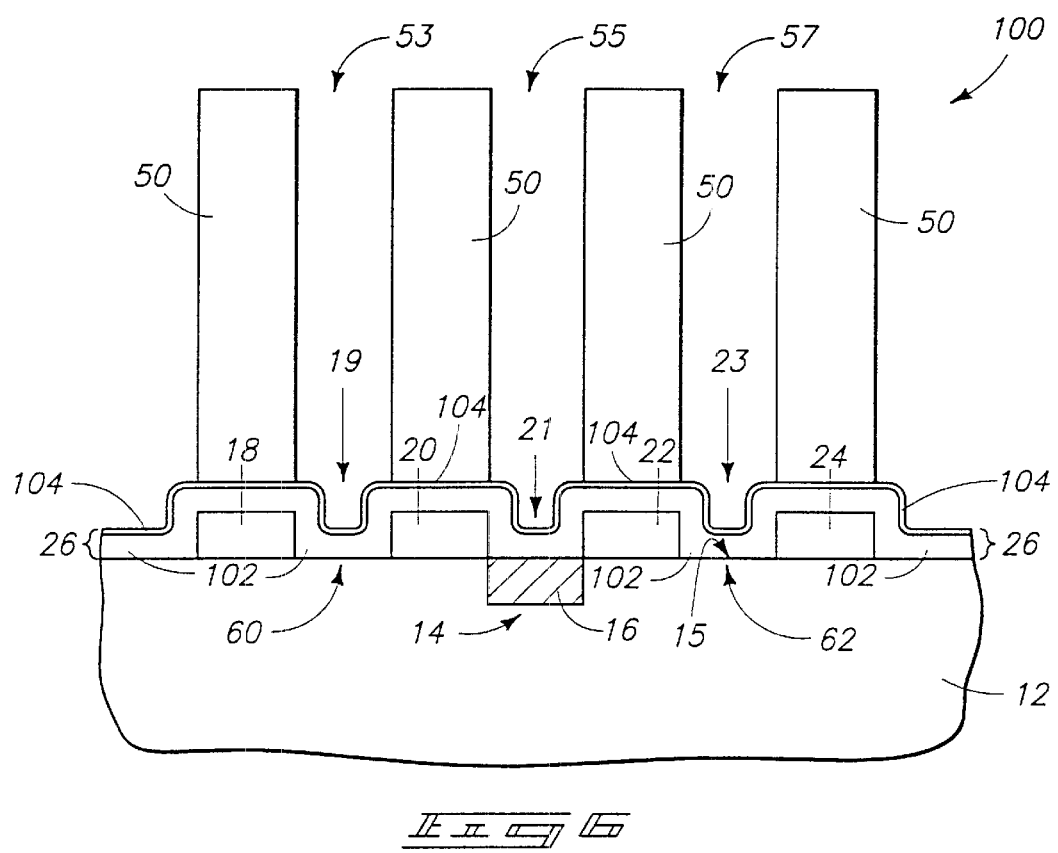
FIG. 6 is a view of the FIG. 5 fragment shown at a processing step subsequent to that of FIG. 5.

Referring to FIG. 6, openings 53, 55 and 57 are extended through mass 50 and to a surface of material 26; and subsequently masking layer 52 (FIG. 5) is removed. Openings 53, 55 and 57 can be extended with an etch selective for the material of mass 50 relative to the material of layer 104, and/or with a timed etch. In particular applications, openings 53, 55 and 57 will comprise relatively high critical dimensions, with exemplary openings having a depth of at least about 2000 Angstroms, and a maximum width of no greater than 800 Angstroms. In specific applications, the openings can have a depth of at least about 2000 Angstroms, and a maximum width of no greater than about 300 Angstroms.

Figure 7:
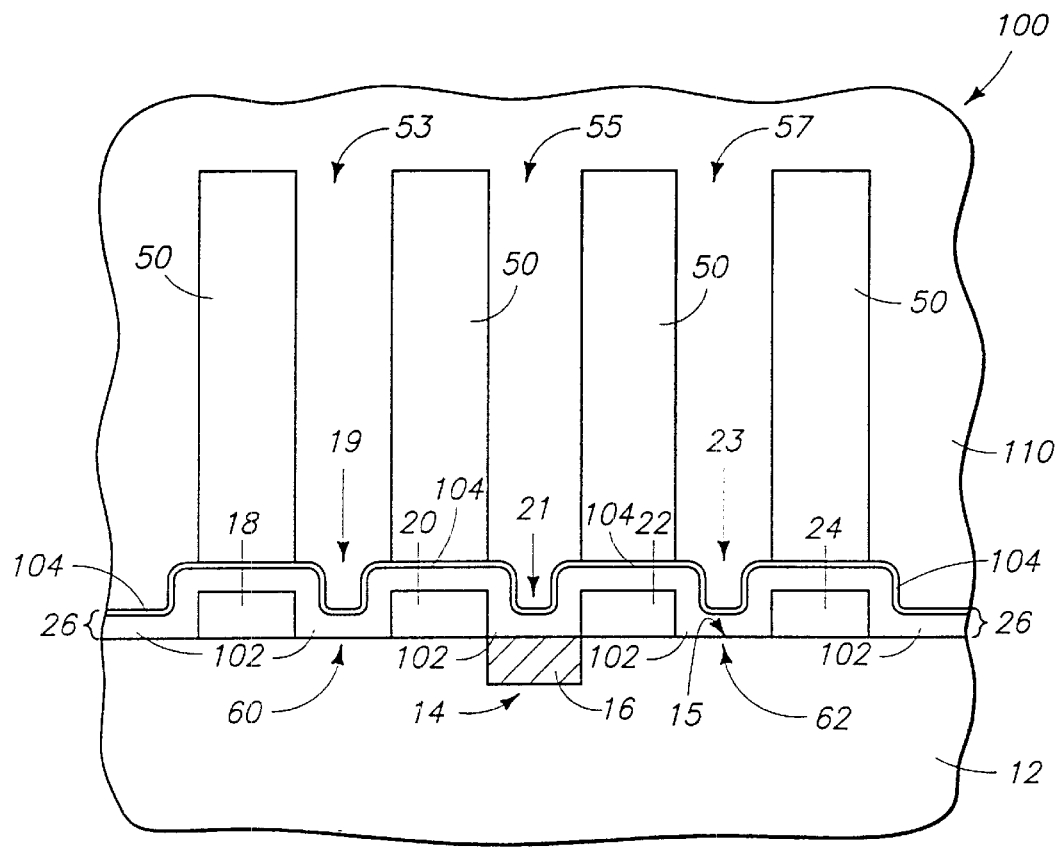
FIG. 7 is a view of the FIG. 5 fragment shown at a processing step subsequent to that of FIG. 6.
Figure 8:
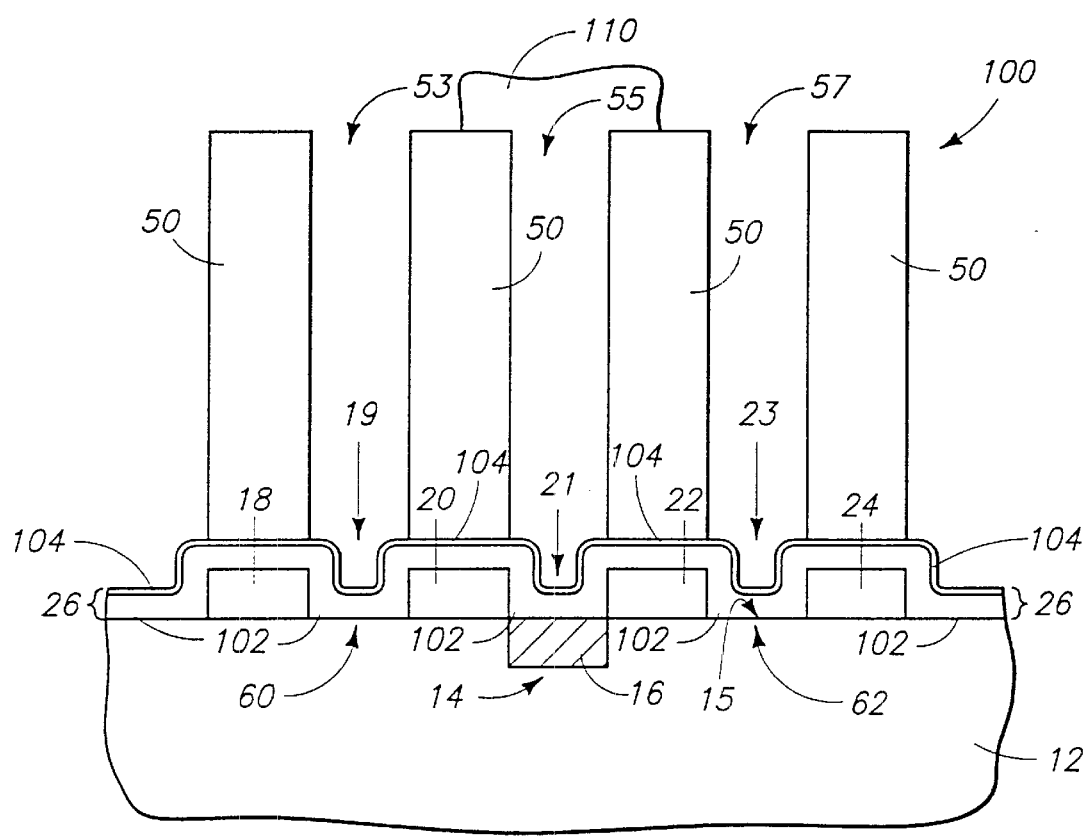
FIG. 8 is a view of the FIG. 5 fragment shown at a processing step subsequent to that of FIG. 7.

Referring to FIGS. 7 and 8, a masking layer 110 is formed within openings 53, 55 and 57; and subsequently developed to remove the masking layer from within openings 53 and 57, while leaving the layer within opening 55.

Masking layer 110 can comprise, for example, photoresist; and can comprise either positive or negative photoresist in particular applications.

If openings 53, 55 and 57 are narrow and deep, the processing of FIGS. 7 and 8 can be accomplished in multiple steps. If masking layer 110 comprises a positive photoresist, and if a reticle is utilized in which underdosing is desired to obtain a correct blocking layer size, a double develop can be utilized. The double develop can be followed by a $O_2/N_2$ reactive ion etch selective for organic material to inorganic oxide material to clear some portions of the resist. Suitable reactive ion etches are, for example, descum etches.

In particular applications, openings 53, 55 and 57 will have widths which are from about 300 Angstroms to about 800 Angstroms, and the light utilized for developing photoresist within the openings will have a wavelength greater than a width of the openings (i.e. a wavelength of for example, 1,980 Å or 2,480 Å). Accordingly, penetration of the light into the openings will be poor. In such applications, it can be preferred to use a negative photoresist as masking layer 110.

As discussed above, material 26 can comprise a layer 102 of silicon nitride (or silicon oxynitride) and an overlying layer 104 of silicon dioxide. The silicon dioxide can alleviate or prevent diffusion of nitrogen from the nitrogen-containing layer 102 into photoresist during the processing of FIGS. 7 and 8. In other processing, an organic material can be utilized either in addition to, or in place of, silicon dioxide material 104. Such organic material can comprise, for example, a deep UV antireflective coating, such as a bottom antireflective coating (BARC) material. However, a difficulty in utilizing a BARC is that it can ultimately be difficult to remove BARC from within openings 53, 55 and 57 during subsequent processing.

Figure 9:
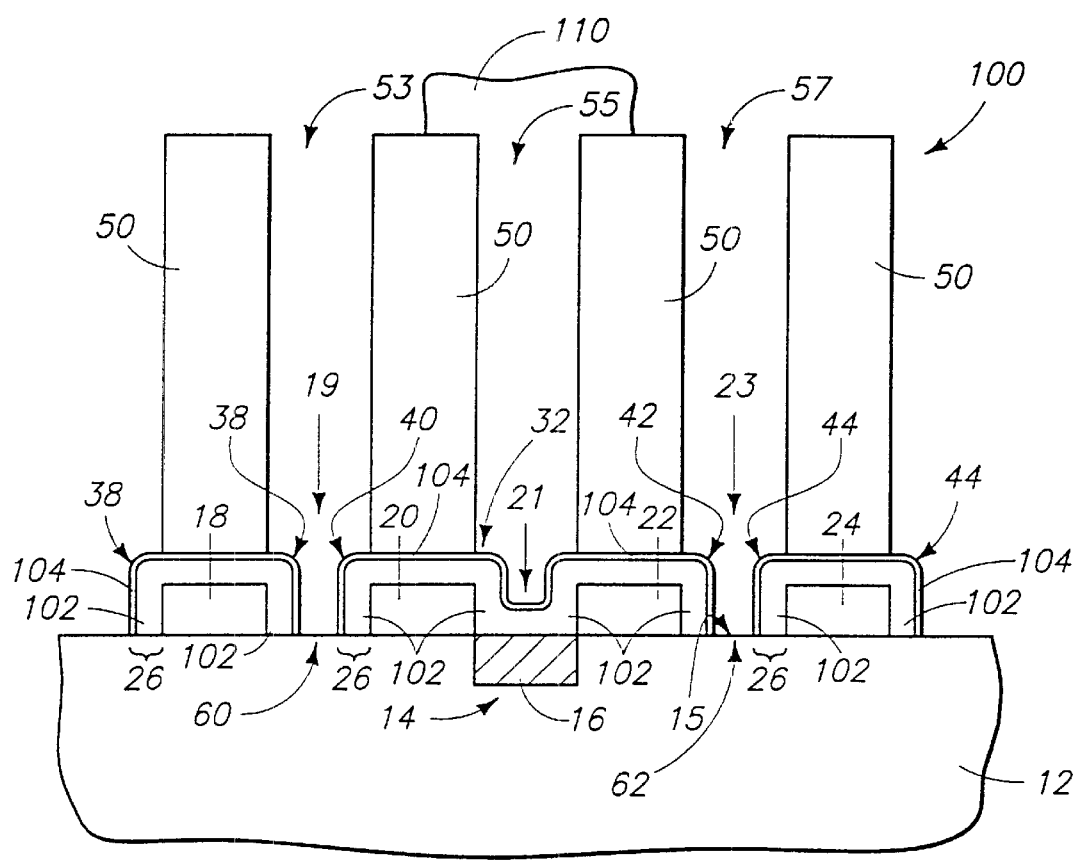
FIG. 9 is a view of the FIG. 5 fragment shown at a processing step subsequent to that of FIG. 8.

Referring to FIG. 9, material 26 (layers 102 and 104) is subjected to anisotropic etching to form spacers 38, 40, 42 and 44 comprising the material. Masking layer 110 protects a segment 32 of material 26 during the anisotropic etching.

Figure 10:
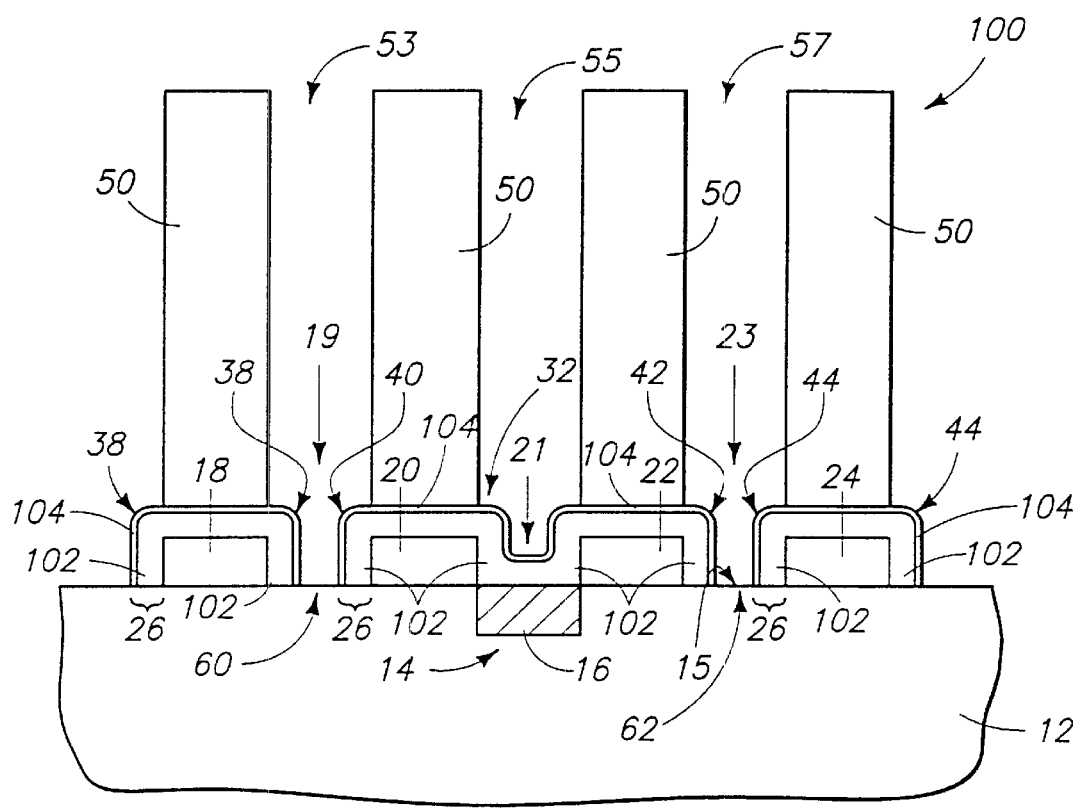
FIG. 10 is a view of the FIG. 5 fragment shown at a processing step subsequent to that of FIG. 9.

Referring to FIG. 10, masking layer 110 (FIG. 9) is removed to leave segment 32 exposed within opening 55. Openings 53, 55 and 57 can be considered to comprise portions of containers for retaining capacitors. Segment 32 can protect conductive component 16 from being electrically connected with capacitor constructions subsequently formed with opening 55.

Figure 11:
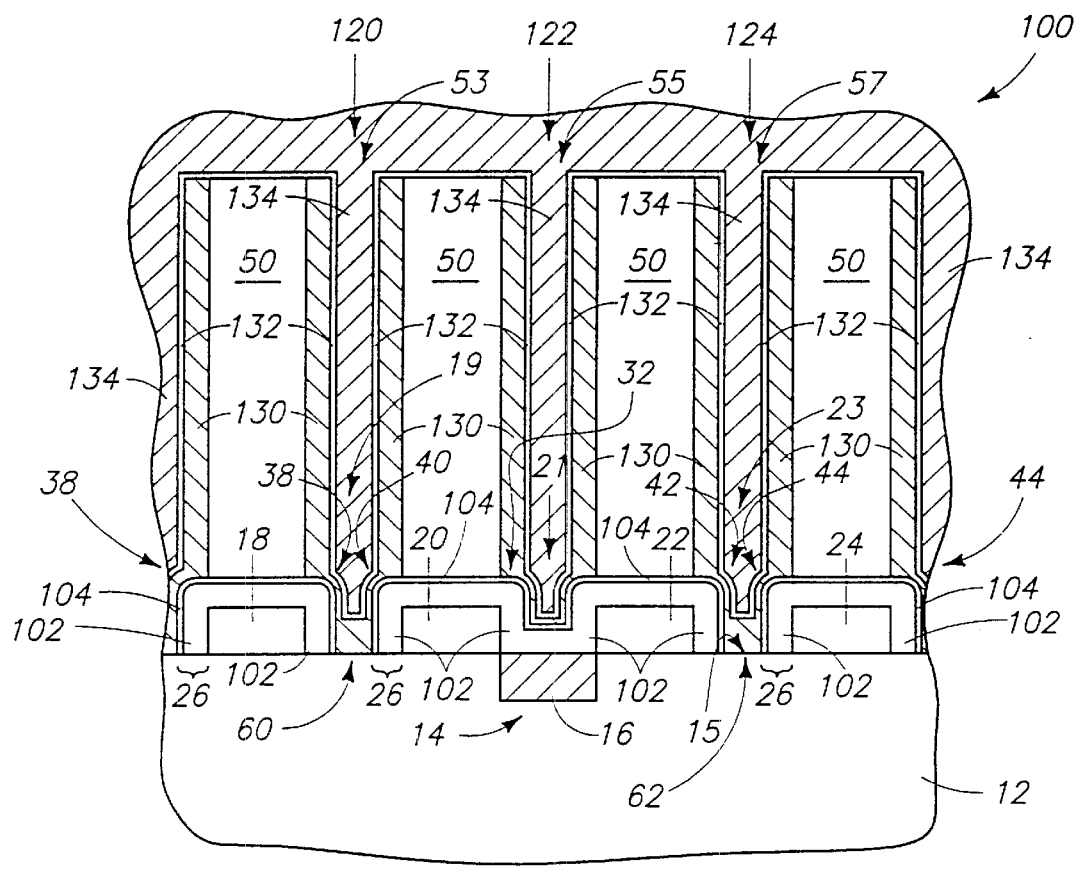
FIG. 11 is a view of the FIG. 5 fragment shown at a processing step subsequent to that of FIG. 10.

FIG. 11 illustrates exemplary capacitor constructions which can be formed within openings 53, 55 and 57. The individual capacitor constructions are labeled as 120, 122 and 124, respectively; and each comprises a conductive first electrode (or storage node) 130, an insulative dielectric material 132, and a conductive second electrode 134. The conductive second electrode, dielectric material and conductive first electrode are arranged relative to one another to operatively form at least portions of the capacitor constructions.

The first electrode materials 130 of capacitors 120 and 124 can be electrically connected with conductive materials (not shown) at node locations 60 and 62, respectively; with such conductive materials being contacts for capacitor storage nodes. The conductive materials at node locations 60 and 62 can form source/drain regions associated with transistors of wordlines 20 and 22 to encompass portions of DRAM cells. Further, conductive material 16 can be associated with a shared source/drain region of transistor devices of lines 20 and 22, and can correspond to a digit line contact. The conductive material 16 is electrically isolated from capacitor electrode material formed within opening 55 by the protective segment 32 of layers 102 and 104. The capacitor material formed within opening 55 can be associated with a container that extends into and out of the page relative to the shown construction 100.

Figure 12:
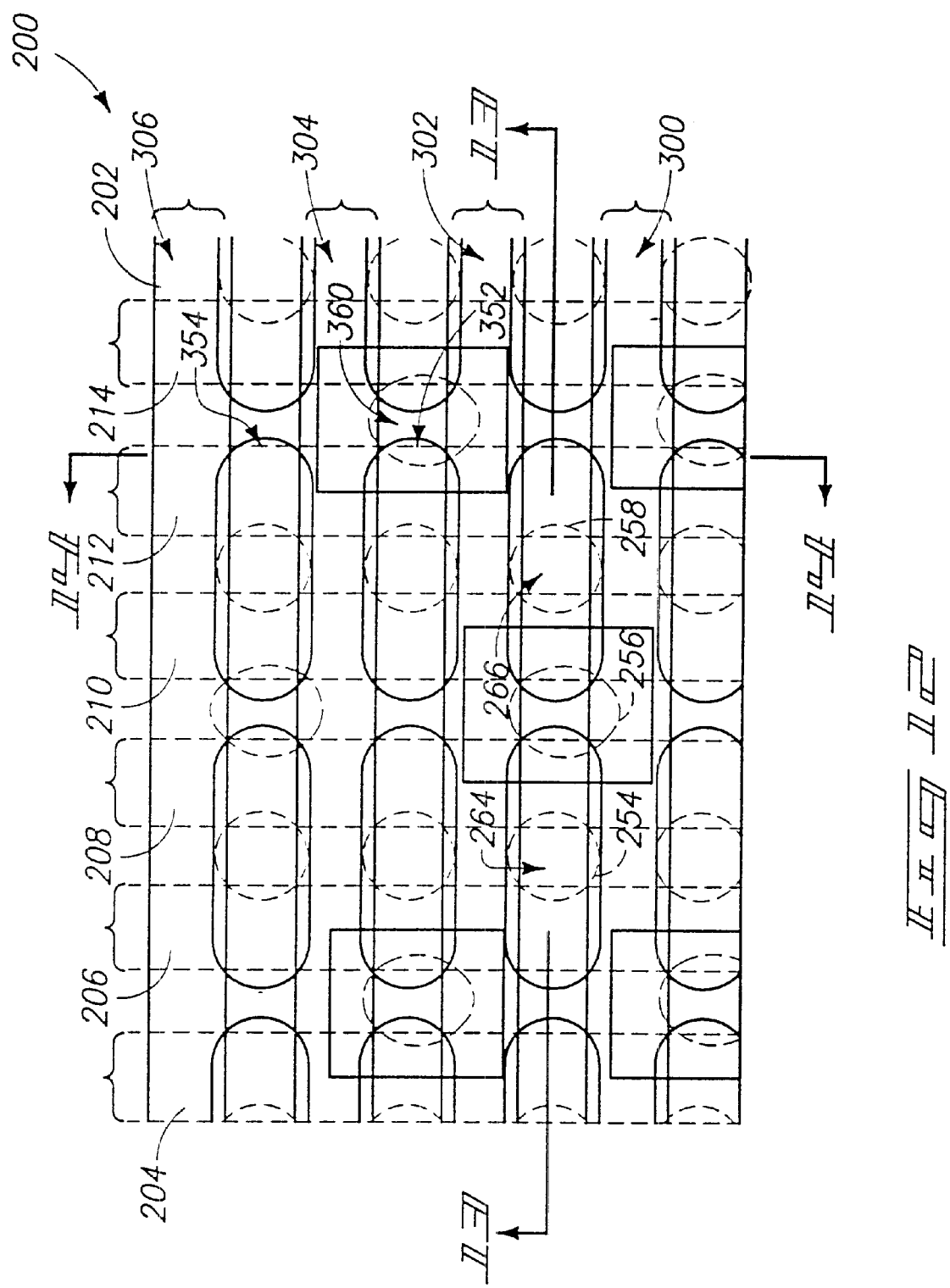
FIG. 12 is a diagrammatic top view of a semiconductor wafer fragment illustrated at a processing step of an exemplary third embodiment of the present invention.
Figure 13:
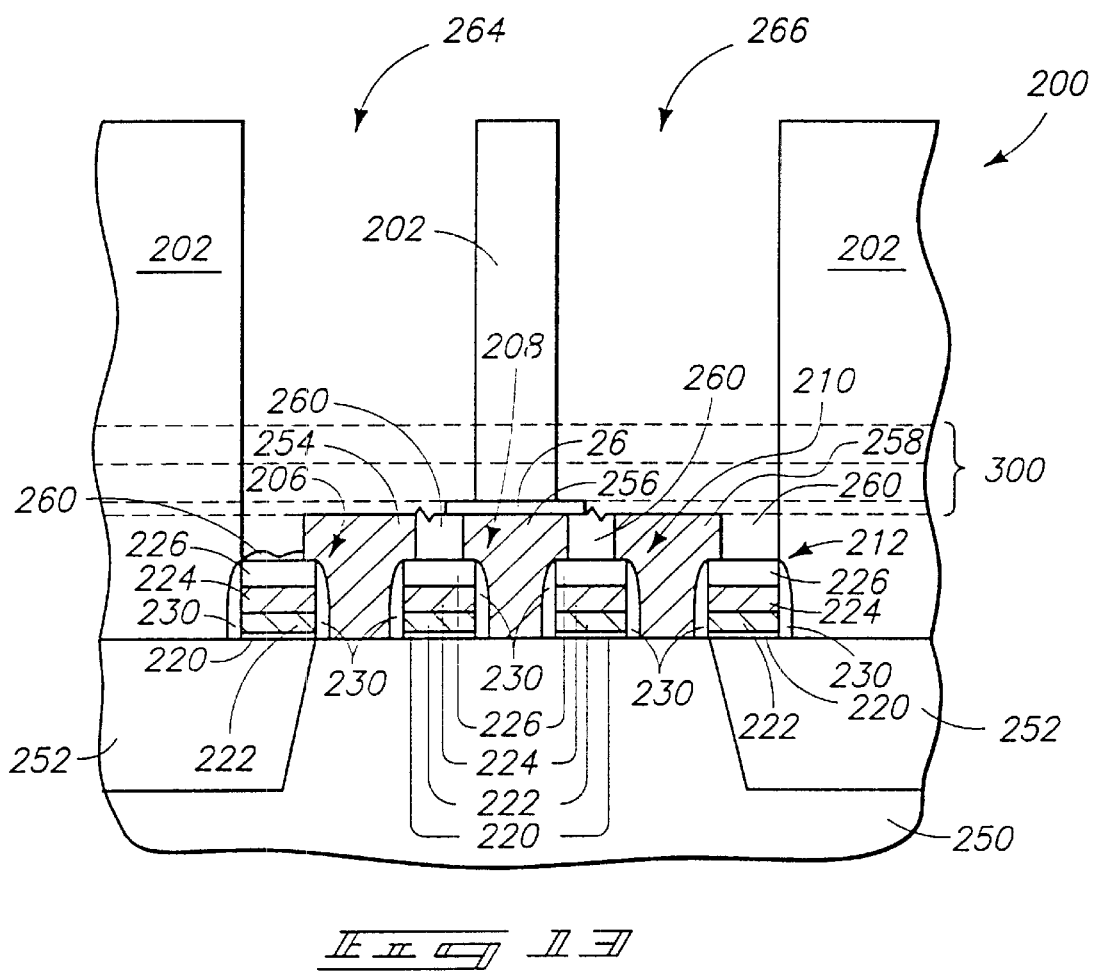
FIG. 13 is a cross-sectional, fragmentary view along the line 13—13 of FIG. 12.
Figure 14:
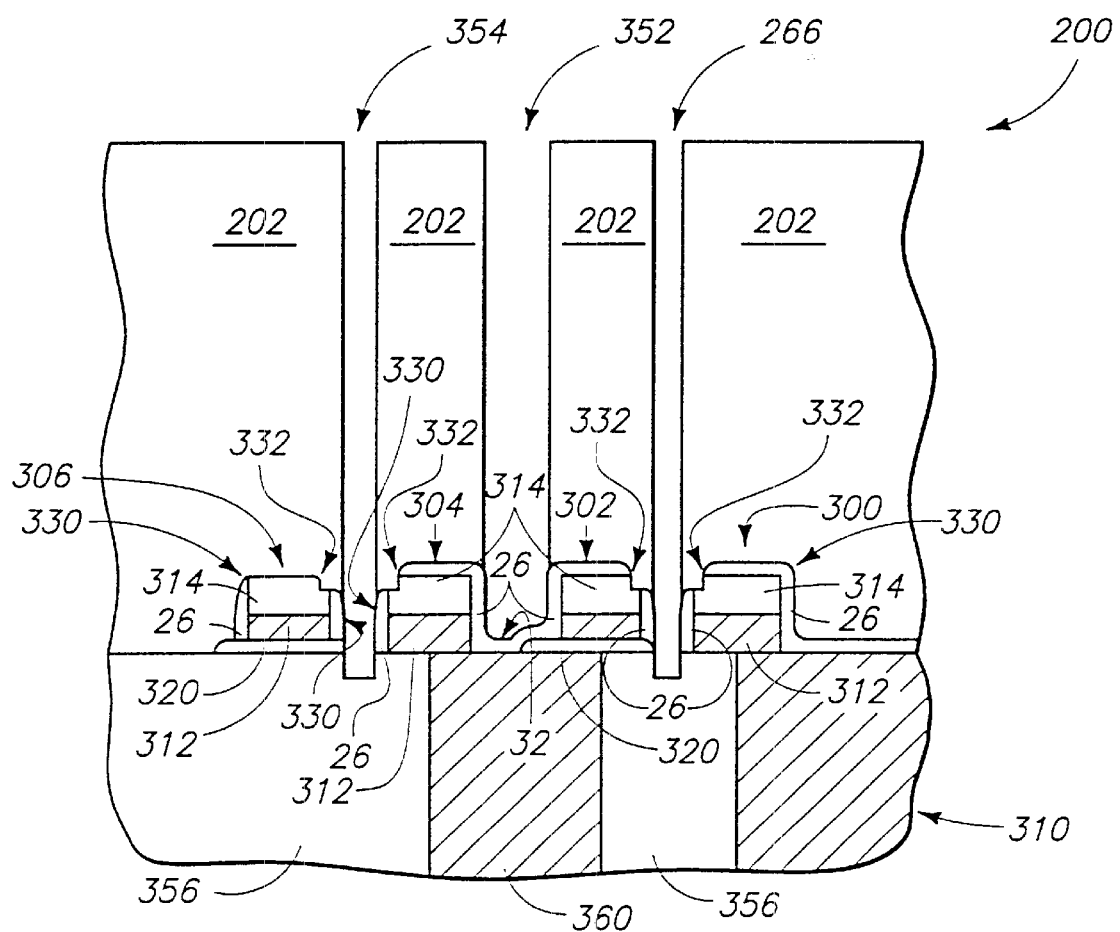
FIG. 14 is a diagrammatic, cross-sectional, fragmentary view along he line 14—14 of FIG. 12.

FIGS. 12–14 illustrate an exemplary construction that can be formed utilizing methodology of the present invention. FIG. 12 is a top view of a fragment 200, and FIGS. 13 and 14 are cross-sectional views along the lines 13—13 and 14—14 of FIG. 12, respectively.

Fragment 200 comprises a mass 202 extending over a plurality of wordlines 204, 206, 208, 210, 212 and 214 (shown in FIGS. 12 and 13, with only wordlines 206, 208, 210 and 212 being shown in FIG. 13). The wordlines comprise layers 220, 222, 224 and 226 which can be, for example, silicon dioxide, conductively-doped silicon, metal, and an insulative cap, respectively. Each of the wordlines also has insulative spacers 230 formed along sidewalls thereof. The wordlines are formed over a substrate 250 which can comprise, for example, monocrystalline silicon. Isolation regions 252 are shown within substrate 250, and beneath wordlines 206 and 212. The wordlines are illustrated in dashed-line view in FIG. 12 to aid in distinguishing the wordlines from bitlines that are also shown in FIG. 12.

Conductive plugs 254, 256 and 258 are shown extending between wordlines 206, 208, 210 and 212, respectively.

An insulative material 260 is shown formed over wordlines 206, 208, 210 and 212; and separating plugs 254, 256 and 258 from one another. Insulative material 260 can comprise for example, silicon dioxide.

An etch stop 26 is shown formed over plug 256. Etch stop 26 can comprise a segment of silicon nitride, silicon oxynitride material and/or silicon dioxide; and can be formed by, for example, the processing described with reference to FIGS. 1–11 for forming segments 32 of material 26. Openings 264 and 266 extend through mass 202. Material 26 protects plug 256 from being exposed during formation of openings 264 and 266. It is noted that the shown construction is formed utilizing an etch which is relatively non-selective for material 202 relative to material 260, and accordingly exposed regions of material 260 have been etched during formation of openings 264 and 266. In particular embodiments, mass 202 can comprise BPSG and insulative material 260 can comprise silicon dioxide.

Fragment 200 comprises buried digit lines 300, 302, 304 and 306 (shown primarily in FIGS. 12 and 14). The digit line 300 is shown in phantom in FIG. 13 to emphasize that the digit line is behind the illustrated view of the wordlines.

The digit lines are within mass 202, and over a substrate 310 which encompasses substrate 250 (FIG. 13) and wordlines 206, 208, 210 and 212. The relative elevational orientation of the bitlines to the wordlines can be understood with reference to FIG. 13.

The digit lines are shown comprising a pair of layers 312 and 314. Such layers can comprise a conductive material and an insulative cap, respectively. The conductive material can comprise, for example, metal, metal nitride and/or conductively-doped silicon; and the insulative cap can comprise one or more of silicon nitride and silicon dioxide. Bitlines 300 and 304 are shown electrically isolated from substrate 310 by an insulative material 320. Material 320 can comprise, for example, silicon dioxide.

Material 26 is shown forming sidewalls spacers 330 relative to bitlines 300, 302, 304 and 306; and forming a protective segment 32 extending between bitlines 302 and 304. Material 26 can comprise the same composition as described relative to FIGS. 1–11, and segment 32 together with spacers 330 can be formed from material 26 utilizing processing such as that described above with reference to FIGS. 1–11.

In the shown embodiment, material 26 has been patterned prior to formation of mass 202. The patterning utilized for anisotropic etching of material 26 was relatively non-selective for material 26 relative to insulative material 314, and accordingly material 314 is shown having gouges 332 extending therein from the etch of material 26.

Mass 202 is shown having openings 266 (also shown in FIG. 13), 352 and 354 extending therein. The etch utilized to form openings 266, 352 and 354 has extended into portions of substrate 310. Such portions can correspond to an insulative material 356 supporting bitlines 300, 302, 304 and 306. In exemplary embodiments, insulative material 356 can comprise borophosphosilicate glass.

Protective segment 32 extends across a bit contact plug 360 and protects the plug from being etched during the formation of openings 266, 352 and 354. Plug 360 is shown in electrical contact with bitline 302.

In subsequent processing, capacitor structures can be formed within the openings 264, 266, 352 and 354 to complete DRAM cell constructions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a protective segment of material over a digit line contact, comprising:

providing a plurality of at least four conductive lines over a semiconductor substrate; the four conductive lines being a first, second, third and fourth conductive line; a first electrical node location being between the first and second conductive lines, a second electrical node location being between the second and third conductive lines, and a third electrical node location being between the third and fourth conductive lines; one of the electrical node locations corresponding to a digit line contact, and the others of the electrical node locations comprising electrical contacts for capacitor storage nodes;

forming a material over the conductive lines;

forming a patterned masking layer to cover a segment of the material extending between a pair of the conductive lines while leaving an other portion of the material uncovered; and anisotropically etching the uncovered portion of the material to form separated spacers from the uncovered portion, the separated spacers being along sidewalls of at least two of the conductive lines; the covered segment of the material remaining after the anisotropic etching and being a protective segment of the material over the digit line contact.

2. The method of claim 1 wherein a mass is formed over the material and patterned to expose the segment of the material and portion of the material prior to forming the patterned masking layer.

3. The method of claim 2 wherein the mass comprises an electrically insulative material.

4. The method of claim 2 wherein the mass comprises borophosphosilicate glass.

5. The method of claim 2 wherein the patterned mass has openings to the segment and portion of the material, the openings being at least about 2000 Å deep and no greater than 800 Å in maximum width.

6. The method of claim 5 wherein the patterned masking layer comprises photoresist formed within the openings.

7. The method of claim 5 wherein the patterned masking layer comprises positive photoresist formed within the openings.

8. The method of claim 5 wherein the patterned masking layer comprises negative photoresist formed within the openings.

9. The method of claim 2 wherein the patterned mass has openings to the segments, the openings being at least about 2000 Å deep and no greater than 300 Å in maximum width.

10. The method of claim 1 wherein the material is an electrically insulative material.

11. The method of claim 1 wherein the material comprises silicon nitride.

12. The method of claim 1 wherein the material comprises silicon oxynitride.

13. The method of claim 1 wherein the material comprises at least two separate layers, one of the at least two layers being silicon nitride and the other being silicon dioxide.

14. The method of claim 13 wherein the silicon dioxide is over the silicon nitride.

15. The method of claim 1 wherein the material comprises at least two separate layers, one of the at least two separate layers being silicon oxynitride and the other being silicon dioxide.

16. The method of claim 15 wherein the silicon dioxide is over the silicon oxynitride.

17. A method of protecting a digit line contact during etching of container openings, comprising:

providing a plurality of at least four conductive lines over a semiconductor substrate; the four conductive lines being a first, second, third and fourth conductive line; a first electrical node location being between the first and second conductive lines, a second electrical node location being between the second and third conductive lines, and a third electrical node location being between the third and fourth conductive lines; one of the electrical node locations corresponding to a digit line contact, and the others of the electrical node locations comprising electrical contacts for capacitor storage nodes;

forming a material over the conductive lines;

anisotropically etching the material to form separated spacers along sidewalls of at least two of the conductive lines, and to remove the material from over the electrical node locations comprising electrical contacts for capacitor storage nodes; a segment of the material remaining over the digit line contact after the anisotropic etching;

forming a mass over the substrate after the anisotropic etching;

etching openings through the mass; a first of the openings extending to one of the electrical node locations comprising electrical contacts for capacitor storage nodes and a second of the openings extending to the other of the electrical node locations comprising electrical contacts for capacitor storage nodes, the first and second openings being container openings for capacitor storage nodes; a third of the openings extending to the segment of the material remaining over the digit line contact; the etch being selective for the mass relative to the material, and thus stopping at about an upper surface of the segment of the material; and forming conductive capacitor storage node material within the first and second openings, and forming capacitor dielectric material and capacitor second electrode material operatively adjacent the capacitor storage node material to form first and second capacitor constructions within the first and second openings, respectively.

18. The method of claim 17 wherein the mass comprises an electrically insulative material.

19. The method of claim 17 wherein the mass comprises borophosphosilicate glass.

20. The method of claim 17 wherein the material is an electrically insulative material.

21. The method of claim 17 wherein the material comprises silicon nitride.

22. The method of claim 17 wherein the material comprises silicon oxynitride.

23. The method of claim 17 wherein the material comprises at least two separate layers, one of the at least two layers being silicon nitride and the other being silicon dioxide.

24. The method of claim 23 wherein the silicon dioxide is over the silicon nitride.

25. The method of claim 17 wherein the material comprises at least two separate layers, one of the at least two separate layers being silicon oxynitride and the other being silicon dioxide.

26. The method of claim 25 wherein the silicon dioxide is over the silicon oxynitride.

* * * * *

UNITED STATES PATENT AND TRADEMARK OFFICE
CERTIFICATE OF CORRECTION

PATENT NO. : 6,620,734 B1
DATED : September 16, 2003
INVENTOR(S) : Mark E. Jost et al.

It is certified that error appears in the above-identified patent and that said Letters Patent is hereby corrected as shown below:

Column 2,
Line 24, replace "view along he line 14-14 of FIG. 12." with -- view along the line 14-14 of FIG. 12. --

Column 4,
Line 61, replace "be utilized as was used above in describing FIGS. 14, where" with -- be utilized as was used above in describing FIGS. 1-4, where --

Column 6,
Line 42, replace "with opening 55." with -- within opening 55. --

Signed and Sealed this

Thirteenth Day of April, 2004

JON W. DUDAS
*Acting Director of the United States Patent and Trademark Office*